US006157548A

United States Patent [19]

Collins et al.

[11] Patent Number: 6,157,548

[45] Date of Patent: Dec. 5, 2000

[54] ELECTRICALLY SHIELDED HOUSING

[75] Inventors: Peter Michael Frederick Collins, Mokena; Terry Dean Thomason, Palos Park, both of Ill.; Ralph A. Hausler, Plymouth, Wis.

[73] Assignee: Illinois Tool Works Inc., Glenview, Ill.

[21] Appl. No.: 09/276,184

[22] Filed: Mar. 25, 1999

[51] Int. Cl.[7] .................................................... H05K 9/00

[52] U.S. Cl. .......................... 361/818; 361/750; 361/751; 361/752; 361/816; 439/606; 439/607; 439/608; 439/609; 174/35 R; 174/51

[58] Field of Search .................................... 361/715–720, 361/748, 785, 750, 751, 818, 752, 794; 439/485, 607, 620, 609, 608; 174/35 R, 356 C, 51, 255, 265, 266, 260

[56] References Cited

U.S. PATENT DOCUMENTS

| | | | |
|---|---|---|---|
| 4,433,206 | 2/1984 | Lewis | 174/35 C |
| 4,603,936 | 8/1986 | Jagen | 439/354 |
| 4,634,208 | 1/1987 | Hall et al. | 439/610 |
| 4,678,260 | 7/1987 | Gallusser et al. | 439/607 |
| 5,101,322 | 3/1992 | Ghaem et al. | 361/715 |
| 5,257,950 | 11/1993 | Lenker et al. | 439/620 |
| 5,539,148 | 7/1996 | Konishi et al. | 174/35 R |
| 5,557,064 | 9/1996 | Isern-Flecha et al. | 361/818 |
| 5,586,011 | 12/1996 | Alexander . | |
| 5,597,919 | 1/1997 | Dull et al. . | |
| 5,597,979 | 1/1997 | Courtney et al. . | |
| 5,704,117 | 1/1998 | Mok et al. . | |
| 5,717,160 | 2/1998 | Bootle . | |
| 5,717,577 | 2/1998 | Mendolia et al. . | |
| 5,880,937 | 3/1999 | Schadhauser et al. | 361/794 |
| 5,926,944 | 7/1999 | Smith et al. | 361/705 |

*Primary Examiner*—Leo P. Picard
*Assistant Examiner*—Boris W. Chervinsky

[57] ABSTRACT

An electrically shielded housing for an electrical device and method therefor having an insert member disposed in a cavity of a non-conductive housing body member. The insert member includes a conductive inner surface portion disposed adjacent an outer surface portion of the body member cavity. A non-conductive outer surface portion of the insert member forms a housing cavity for receiving an electrical device. The conductive inner surface portion of the insert member at least partially electrically shields the electrical device, and the non-conductive outer surface portion of the insert member insulates the electrical device from the conductive inner surface portion thereof.

18 Claims, 2 Drawing Sheets

ELECTRICALLY SHIELDED HOUSING

BACKGROUND OF THE INVENTION

The invention relates generally to electrically shielded housings for electrical components and methods therefor.

Electrical devices are commonly mounted in housings made from non-conductive materials like plastics. The increasingly widespread use of electrical devices in noisy electrical environments however requires that the devices be shielded from electromagnetic interference, particularly radio frequency interference. In the automotive industry, for example, low voltage micro-controllers, pressure sensors, electric power steering devices and other noise sensitive electrical devices are employed increasingly in or near the engine compartment where shielding from electromagnetic interference, otherwise referred to herein as electrical noise or interference, is required. Unfortunately, non-conductive housings alone provide no electrical shielding for the electrical devices mounted or housed therein.

It is known in some applications to insert mold or otherwise dispose a stamped or extruded metal lining in a plastic housing cavity to provide electrical shielding for an electrical device subsequently mounted therein. See for example, U.S. Pat. No. 5,704,117 entitled “Method Of Assembling An EMI Shield Around An Electronic Component”. The stamped metal lining however constitutes an exposed conductive surface in the housing cavity that presents a hazardous condition for short circuiting electrical devices mounted therein. The metal lining components are also relatively costly to manufacture and substantially increase housing weight. There are also sever limitations on the extent to which metal may be stamped or extruded to define intricate structural features, and for use in increasingly small housing cavities, resulting generally from the shear and tensile strength of the metal.

It is also known to apply a conductive ink onto a surface of a plastic housing cavity, for example in a spraying operation. Applying a conductive ink however generally requires some masking of the housing or cavity to prevent overspray, which is a laborious and costly procedure. Also, it is difficult to electrically connect a wire or lead to a conductive ink applied to the housing surface for grounding purposes. The conductive ink also forms an exposed conductive surface in the housing cavity that may short circuit electrical devices disposed therein, as discussed above.

It is also known to co-inject conductive and no-conductive plastics to form a plastic housing having an electrically shielded cavity. The conductive plastic is loaded with a conductive material and forms a conductive lining in the housing cavity. The co-injection of process however is not used widely, and has several disadvantages, including difficulty in grounding the conductive plastic lining and limitations on the thinness and dimensions; thereof. The conductive plastic lining also has an exposed conductive surface, which is undesirable as discussed above.

It has been proposed to insert mold a relatively thin plastic lining, made conductive by a conductive filler material, in a plastic housing, cavity for an electrical device. The plastic lining however is only suitable for static charge dissipation, not electrical shielding, since there is a severe limit on extent to which it may be made conductive by the conductive filler material. The plastic lining moreover must be formed separately in a prior molding operation, which is costly and complicated by the required thinness of the plastic lining. Additionally, the amount of conductive filler material required to make the plastic lining sufficiently conductive for static charge dissipation renders the plastic lining too brittle, and thus subject to failure. Also, the conductive plastic lining forms an exposed conductive surface on the housing cavity that presents a hazard for short circuiting electrical devices disposed therein as discussed above.

It is also known to manufacture electrically shielded plastic housings for electrical devices in thermal vacuum forming processes. In one known process, a non-woven conductive layer of tin and bismuth fibers is laminated onto a plastic sheet during a thermal vacuum forming process. The thermal vacuum forming process however is not generally capable of very well defining intricate structural features as is required in increasingly small housings. There are also additional costs associated with the lamination of the conductive layer on the plastic sheet, which is usually performed manually, and is otherwise not suitable for high production operations. The conductive fibrous layer also forms an exposed conductive surface on the housing cavity that may short circuit an electrical device disposed therein as discussed above.

The present invention is drawn toward advancements in the art of electrically shielded housings for electrical devices.

An object of the invention is to provide novel electrically shielded housings and methods therefor that overcome problems in the art.

Another object of the invention is to provide novel electrically shielded housings and methods therefor that are economical.

Another object of the invention is to provide novel electrically shielded housings having a cavity for receiving an electrical device and methods therefor that insulate the electrical device from the electrical shielding.

A further object of the invention is to provide novel electrically shielded housings and methods therefor comprising an insert member, formed preferably in al thermal forming operation, insert molded with a non-conductive body member to provide an electrically insulated and electrically shielded housing cavity for an electrical device.

Yet another object of the invention is to provide novel electrically shielded housings and methods therefor comprising insert molding a partially formed insert member with a non-conductive body member to provide an electrically insulated and electrically shielded housing cavity for an electrical device, whereby the partially formed insert member takes the exact intricate detail of a mold cavity during the inserting molding operation.

A further object of the invention is to provide novel electrically shielded housings and methods therefor comprising an at least partially formed insert member having a conductive inner surface portion and a non-conductive outer surface portion that may be assembled with a non-conductive body member, preferably in an insert molding operation, to provide an electrically insulated housing cavity that electrically shields an electrical device disposed therein.

A more particular object of the invention is to provide novel electrically shielded housings and methods therefor comprising generally an insert member disposed in a cavity of a non-conductive housing body member. The insert member includes a conductive inner surface portion disposed adjacent an outer surface portion of the body member cavity. A non-conductive outer surface portion of the insert member forms a housing cavity for receiving an electrical device. The conductive inner surface portion of the insert member at least partially electrically shields the electrical device, and the non-conductive outer surface portion of the insert member insulates the electrical device from the conductive inner surface portion thereof.

These and other objects, aspects, features and advantages of the present invention will become more fully apparent upon careful consideration of the following Detailed Description of the Invention and the accompanying Drawings, which may be disproportionate for ease of understanding, wherein like structure and steps are referenced generally by corresponding numerals and indicators.

DETAILED DESCRIPTION OF THE INVENTION

Figure 1:
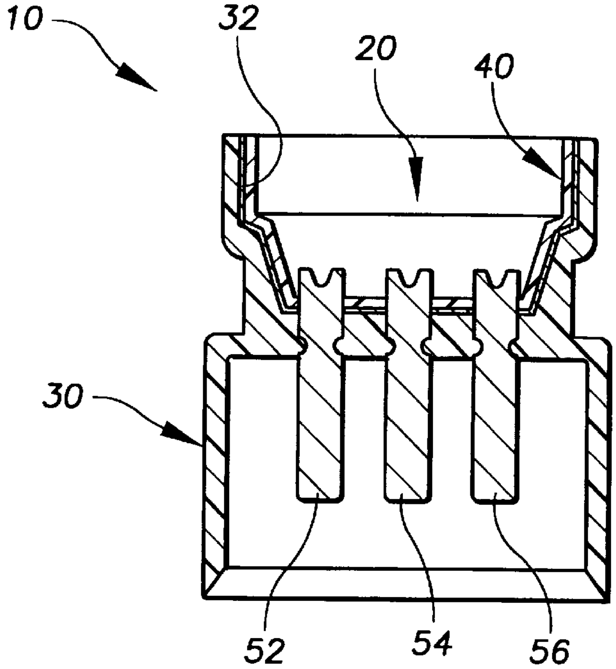
FIG. 1 is a partial sectional view of a housing having an electrically shielded cavity for receiving an electrical device according to the invention.

FIG. 1 is an electrically shielded housing 10 having a housing cavity 20 for receiving an electrical device, not illustrated, mounted therein. The housing 10 comprises generally a non-conductive housing body member 30 having a body member cavity with an outer surface portion 32, illustrated partially in FIG. 3, for receiving an insert member 40. The housing body member 30 may have most any shape, and may be an unassembled portion of a housing assembly forming a fully or partially enclosed housing cavity. The housing, may, for example, be assembled with a separate housing cover, not illustrated, disposed over the housing cavity 20 after assembly of the electrical device therein.

Figure 3:
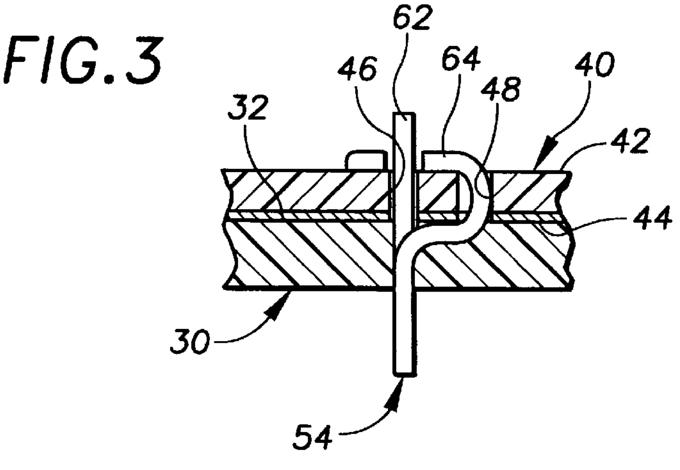
FIG. 3 is a partial sectional view of an insert member having an electrical shielding surface portion and a grounding pin electrically coupled thereto molded into a housing body member.

The housing 10 comprises an insert member 40 having generally a non-conductive outer surface portion 42 and a conductive inner surface portion 44. The insert member 40 is assembled generally with the body member 30 to form at least a portion of the housing cavity 20, which accommodates the electrical device. FIGS. 1 and 3 illustrate the conductive inner surface portion 44 of the insert member 40 disposed adjacent the outer surface portion 32 of the body member cavity 30 when the insert member is disposed therein.

The conductive inner surface portion 44 of the insert member 40 electrically shields, at least partially, an electrical device disposed in the housing cavity 20, and the non-conductive outer surface portion 42 of the insert member 40 electrically insulates the electrical device from the conductive inner surface portion 44 thereof. The non-conductive outer surface portion 42 of the insert member 40 thus prevents or at least substantially reduces the risk of short circuiting the electrical device, which is a problem common in prior art shielded housings, by preventing electrical contact between the electrical device and the conductive inner surface portion 44 of the insert member 40.

In one embodiment, the insert member 40 comprises a non-conductive material having an inner surface and an outer surface, and a conductive coating applied to the inner surface of the non-conductive material. Thus the non-conductive material form, the non-conductive outer surface portion 42 of the insert member 40, and the conductive coating forms the conductive inner surface portion 44 thereof.

The non-conductive material of the insert member is preferably a polymer material, for example a polyester sheet material or some other formable non-conductive material. The conductive coating is preferably a conductive ink applied to the non-conductive material, for example in a silk screening or spraying process or some other known process. The conductive ink has generally a conductive component, for example a silver or carbon based conductive material, and a carrier component, for example an acrylic or polyester or flouro-polymer based carrier material. These and other conductive inks are desirable for their ability to be formed after application thereof to the non-conductive material, for example in thermal forming and insert molding processes, as discussed further below. These exemplary conductive inks are also suitable for relatively high temperature applications, for example around 300 degrees Fahrenheit, typical of automotive engine compartments.

One known silver base conductive ink system suitable for use in the present invention is Product No. CB028 available from Dupont, Wilmington, Del. Other known silver based conductive ink systems include Product Nos. 479SS and 729A available from Acheson Coloids, Port Huron, Mich. A carbon based conductive ink system suitable for use with the present invention is Part No. SA-76009 PF-016 also available from Acheson Coloids, Port Huron, Mich. Other commercially available conductive inks having these and other conducting and carrier medium compositions may be used alternatively.

In an alternative embodiment, the insert member 40 comprises a conductive material having an inner surface and an outer surface, and a non-conductive coating applied to the outer surface of the conductive material. Thus the conductive material forms the conductive inner surface portion 44 of the insert member 40, and the non-conductive coating forms the non-conductive outer surface portion 42 thereof. The conductive material is preferably a conductive polymer or other formable material, and the non-conductive coating is for example a clear coat.

According to an alternative embodiment of the invention, the conductive coating applied to the inner surface of the insert member 40 is a metal based material applied to the non-conductive material in some other process, for example in an electroplating or an electroless plating process, or a vacuum metallizing process, or a cathode sputtering process.

According to another alternative embodiment of the invention, the insert member 40 is comprised of a co-extruded sheet having a conductive layer and a non-conductive layer. The conductive layer may be a polymer loaded with a steel fiber or a graphite fiber for conductivity. The non-conductive layer of the co-extruded sheet thus forms the non-conductive outer surface portion 42 of the insert member 40, and the conductive layer of the co-extruded sheet forms the conductive inner surface portion 44 of the insert member.

The insert member 40 is preferably insert molded with the body member 30, whereby the body member 30 is also formed during the insert molding operation. Where the insert member 40 is formed of a thermally formable material., like a relatively thin polymer, it is not necessary to fully or completely form the insert member 40 prior to insert molding, since the insert member 40 will be formed completely during the molding operation. This result was unexpected by the inventors of the present invention. The insert member 40 may be formed partially in a low cost insert member forming operation, as discussed further below. Also, a partially formed insert member does not require accurate alignment in the mold cavity prior to the insert molding operation, which reduces labor and costs. This result was also unexpected by the inventors of the present invention. Insert molding the insert member with the body member also eliminates the need for adhesives or epoxies or other assembly means.

The insert member 40 is preferably formed at least partially in a thermal forming operation, for example in a thermal vacuum forming operation. Thermal forming operations are very cost effective, and are integratable relatively easily in an insert molding production line operation. And as discussed generally above, a thermally formed insert member does need not be formed completely or precisely in the thermal molding operation since thermally formable materials will be formed completely during the insert molding operation.

In alternative embodiments the insert member may be formed by other means, including among others, molding, stamping and extruding operations. The insert member may also be assembled with the housing body member by means other than insert molding operations. The insert member, for example, may be epoxied or snap-fit or otherwise assembled with the housing body member after forming the body member in a molding or stamping or extruding or other forming operation.

The housing 10 may generally have one or more electrically conducting connector members or leads or pins protruding into the housing cavity 20 for electrical coupling with an electrical device mounted therein. FIG. 1 illustrates electrical blades or pins 52, 54 and 56 protruding into the cavity of the body member 30. The electrical leads are preferably insert molded with the insert member 40 and body member 30.

FIG. 3 illustrates one of the electrically conducting pins 54 having a first portion 62 disposed partially through a first opening 46 of the insert member 40, and one or more flange portions 64 disposed through corresponding second openings 48 of the insert member 40. The flange portions 64 of the electrical pin 54 are preferably bent and crimped about inner and outer portions 42 and 44 of the insert member 40 to provide an electrical connection with the conductive portion 44 thereof, for example to connect the conductive inner portion 44 of the insert member 40 to electrical ground via the conductor pin 54. The insert member 40 having the electrical pin 54 crimped thereto is preferably insert molded in the cavity of the body member 30 after crimping.

Figure 4:
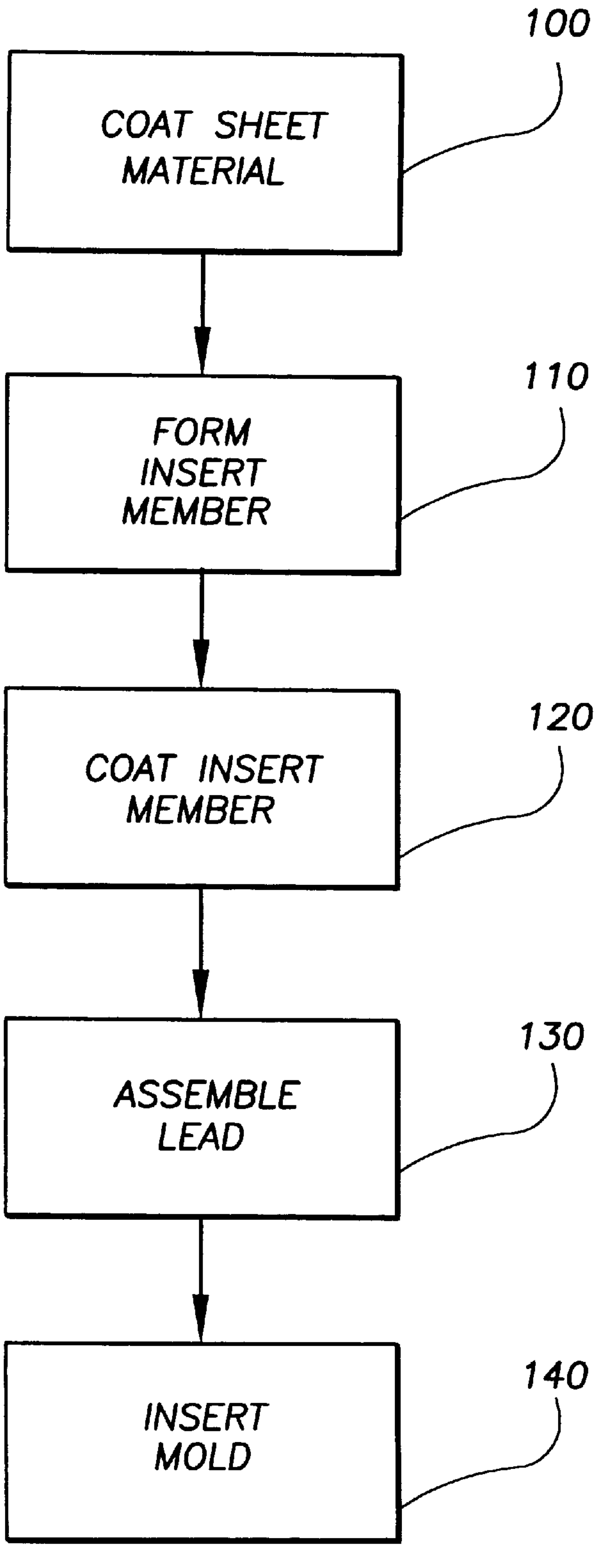
FIG. 4 is a process flow diagram for manufacturing an electrically shielded housing according to the invention.

FIG. 4 is a process flow diagram for manufacturing an electrically shielded housing having a cavity for receiving an electrical device according to the present invention. Not all phases of the process flow diagram are required for all modes of manufacture discussed herein, however, and not all stages of the process are performed necessarily in the order of the process flow diagram. Generally the insert member 40 is initially formed at least partially in a forming process, and any conducting pins that are to be electrically coupled to the conductive inner portion thereof are assembled prior to assembling the insert member with the body member.

In preferred a mode of manufacture, a formable non-conductive sheet material, for example a polymer sheet material, is first coated with a conductive ink, illustrated at 100 in FIG. 4. Applying the conductive ink to a sheet material generally simplifies the coating operation. Applying the conductive ink to a sheet material also ensures a relatively uniform application of the conductive ink coating, which will provide improved electrical shielding, since it is generally easier to apply the ink onto a flat surface than into a cavity. The conductive ink is preferably applied to the sheet material in a silk screening operation which is very economical, does not produce overspray and requires no masking.

Alternatively, at 100 in FIG. 4, an insulating or non-conductive coating, like a clear coat, may be applied to a stock sheet of conductive material, preferably also in a silk screening operation. The conductive or non-conductive coatings may be applied alternatively by means other than silk screening, as discussed above. Alternatively, at 100 in FIG. 4, the conductive sheet material may be coated with a conductive material by forming a two layer sheet material with conductive and non-conductive layers in a co-extruding process, as discussed above.

The sheet material having the conductive or non-conductive coating applied thereto, or alternatively a co-extruded sheet material having conductive and non-conductive layers, is formed at least partially into the insert member 40. as illustrated at 110 in FIG. 4. In a preferred mode of manufacture, the non-conductive stock sheet material coated with the conductive ink at 100 is formed in a thermal forming process to provide at least the general shape of the insert member 40. In other embodiments, the insert member 40 is formed by means other than thermal forming, for example in molding or extruding or other operations, as discussed generally above.

Figure 2:
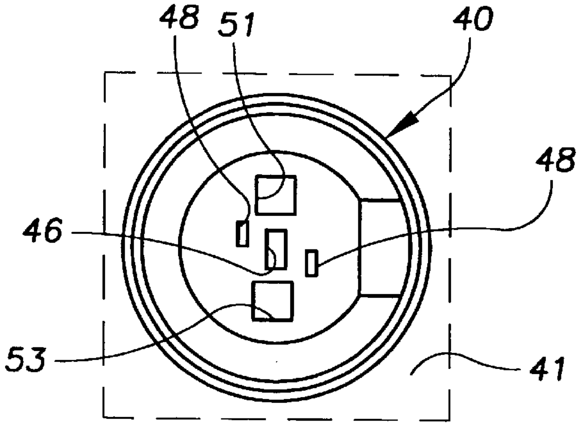
FIG. 2 is top plan view of a non-conductive insert member having a shielded surface portion insert moldable into a cavity of a housing body member.

FIG. 2 is a plan view of an exemplary insert member 40 formed at least partially in some forming process. The insert member may also be subject to additional processing at 110 besides merely forming the general part shape. In operations where the insert member 40 is formed thermally, for example, it may be subject to a cutting operation to remove excess or waste material 41 therefrom. The insert member may also be subject to a die or other cutting operation to form recesses therein, for example recesses 46, 51 and 53 to accommodate conducting pins 52, 54 and 56 during later assembly stages. FIG. 2 also illustrates first and second openings 46 and 48 formed in the insert member 40 for accommodating corresponding first and second portions 62 and 64 of conducting pin 54 crimped thereto, as illustrated in FIG. 3 and discussed above.

In an alternative embodiment, the insert member 40 is formed thermally or otherwise of a non-conductive or a conductive material before application of the coating, as discussed above. In this alternative embodiment, the coating is applied to the insert member after forming, as illustrated at 120 in FIG. 4. An insert member formed of a non-coated non-conductive polymer sheet material, at 110 in FIG. 4, for example, may be spray coated thereafter with a conductive ink, as illustrated at 120 in FIG. 4. Alternatively, an insert member formed of a conductive material at 110 of FIG. 4 may be coated with a non-conductive clear coat at 120 of FIG. 4. According to these alternative operations, it is not necessary to apply the coating to the sheet material at 100 in FIG. 4 before forming the insert member.

In embodiments where the insert member has a conductive coating applied thereto, the conductor pin is preferably assembled therewith after application of the conductive coating since better electrical contact is obtained by crimping the pin portion 64 to the conductive coating portion of the insert member, as illustrated at 130 of FIG. 4. Alternatively, the conductive coating may be applied, for example by spraying, after the conductor pin is coupled to the insert member. In embodiments where the insert member is formed of a conductive material, the conducting pin may be crimped thereto before application of the non-conductive clear coat.

The insert member 40 is assembled with the housing body member 30, as illustrated at 140 in FIG. 4. The at least partially formed insert member 40 is preferably insert molded with the body member 30 so that the conductive inner surface portion 44 of the insert member 40 is disposed adjacent the outer surface portion 32 of the body member cavity and the non-conductive outer surface portion 42 of the insert member 40 forms the housing cavity. Any unformed portion of the insert member 40 is formed completely during the insert molding operation, as discussed above. Other portions of the housing 10, for example the conducting leads 52, 54 and 56 may also be and are preferably insert molded with the body member 30.

As discussed above, the body member 30 may be formed by means other than insert molding, for example in molding or casting or extruding or other forming operations. When the body member 30 is formed by one of these alternative forming operations, the insert member 40 may be assembled in the body member cavity and fastened thereto by an epoxy or by snap-fitting structure or by other known means.

An electrical device thus may be mounted or otherwise disposed in the housing cavity 20 where it is at least partially electrically shielded from electromagnetic interference, especially radio frequency interference, by the conductive inner surface portion 44 of the insert member 40. The conductive inner surface portion 44 of the insert member 40 also shields, or prevents, the emission of electrical noise generated by the electrical device from the housing 10. And the non-conductive outer surface portion 42 of the insert member 40 insulates the electrical device from the conductive inner surface portion 44 of the insert member 40.

While the foregoing written description of the invention enables one of ordinary skill to make and use what is considered presently to be the best mode thereof, those of ordinary skill will understand and appreciate the existence of variations, combinations, and equivalents of the specific exemplary embodiments herein. The invention is therefore to be limited not by the exemplary embodiments herein, but by all embodiments within the scope and spirit of the appended claims.

What is claimed is:

1. An electrically shielded electrical device connector housing, comprising:
 - a non-conductive housing body member having a body member cavity with an outer surface portion;
 - an insert member having a non-conductive outer surface portion and a conductive inner surface portion, the insert member disposed in the body member cavity,
 - the conductive inner surface portion of the insert member disposed adjacent the outer surface portion of the body member cavity,
 - the non-conductive outer surface portion of the insert member forming a housing cavity;
 - a conducting pin embedded in the body member and electrically coupled to the conductive inner surface portion of the insert member, a portion of the conducting pin protruding through the insert member into the housing cavity.

2. The housing of claim 1, the insert member comprises a non-conductive material having an inner surface and an outer surface, and a conductive coating applied to the inner surface of the non-conductive material to form the conductive inner surface portion of the insert member.

3. The housing of claim 2, the non-conductive material of the insert member is a polymer material.

4. The housing of claim 2, the conductive coating is a conductive ink.

5. The housing of claim 4, the conductive ink includes silver as a conducting medium and at least one of an acrylic, polyester and flouro-polymer as a carrier medium.

6. The housing of claim 2, the insert member is insert molded in the body member cavity.

7. The housing of claim 1, the insert member comprises a conductive material having an inner surface and an outer surface, and a non-conductive coating applied to the outer surface of the conductive material to form the non-conductive outer surface portion of the insert member.

8. The housing of claim 1, the conductive inner surface portion of the insert member captured between the non-conductive housing body member and the non-conductive outer surface portion of the insert member.

9. The housing of claim 1, the insert member formed of a non-conductive sheet material having a conductive coating applied to one of two opposite surfaces thereof.

10. An electrically shielded insert molded housing for an electrical device, comprising:
 - a non-conductive body member having a body member cavity with an outer surface;
 - an insert member having a non-conductive outer surface and an electrically shielding conductive inner surface opposite the outer surface thereof,
 - the insert member insert molded in the body member cavity with the electrically shielding conductive inner surface of the insert member adjacent the outer surface of the body member cavity;
 - an electrical device housing cavity formed by the non-conductive outer surface of the insert member,
 - the electrical device housing cavity electrically insulated from the electrically shielding conductive inner surface of the insert member by the non-conductive outer surface thereof.

11. The housing of claim 10, a conducting pin molded in the body member and electrically coupled to the electrically shielding conductive inner surface of the insert member, a portion of the conducting pin protruding through the insert member into the electrical device housing cavity.

12. The housing of claim 10, the insert member formed of a non-conductive polymer sheet having a conductive ink coating applied at least partially to a surface thereof.

13. The housing of claim 10, the insert member comprises a non-conductive polymer material and a conductive coating applied at least partially to one surface thereof.

14. The housing of claim 10, the electrical device housing cavity having an insert molded form.

15. The housing of claim 10, the electrically shielding conductive inner surface of the insert member captured entirely between the non-conductive body member and the non-conductive outer surface of the insert member.

16. An insert molded housing for an electrical device, comprising:

a non-conductive body member having a body member cavity with an outer surface;

an insert member having a non-conductive outer surface and a conductive inner surface opposite the outer surface thereof, the insert member insert molded in the body member cavity, the conductive inner surface of the insert member captured between the outer surface of the body member cavity and the non-conductive outer surface of the insert member;

a non-conductive housing cavity in the non-conductive outer surface of the insert member.

17. The housing of claim 16, the insert member formed of a non-conductive polymer sheet having a conductive ink coating applied at least partially to a surface thereof.

18. The housing of claim 16, a conducting pin molded in the body member and electrically coupled to the conductive inner surface of the insert member, a portion of the conducting pin protruding into the housing cavity.

* * * * *